(12) United States Patent
Nishimura et al.

(10) Patent No.: US 6,885,262 B2
(45) Date of Patent: Apr. 26, 2005

(54) BAND-PASS FILTER USING FILM BULK ACOUSTIC RESONATOR

(75) Inventors: Kosuke Nishimura, Ube (JP); Masataka Fujinaga, Ube (JP); Masahide Kondo, Ube (JP)

(73) Assignee: Ube Industries, Ltd., Yamaguchi (JP)

( * ) Notice: Subject to any disclaimer, the term of this patent is extended or adjusted under 35 U.S.C. 154(b) by 0 days.

(21) Appl. No.: 10/697,474

(22) Filed: Oct. 30, 2003

(65) Prior Publication Data

US 2004/0085160 A1 May 6, 2004

(30) Foreign Application Priority Data

Nov. 5, 2002 (JP) ........................................ 2002-321210

(51) Int. Cl.$^7$ ............................ H03H 9/56; H03H 9/54
(52) U.S. Cl. ........................................ 333/189; 333/191
(58) Field of Search ................................ 333/186–192, 333/133

(56) References Cited

U.S. PATENT DOCUMENTS 6,262,637 B1 * 7/2001 Bradley et al. ............. 333/133

FOREIGN PATENT DOCUMENTS

| JP | 52-19044 A | 2/1977 |
| JP | 58-153412 A | 9/1983 |
| JP | 60-142607 | 7/1985 |
| JP | 2-13109 A | 1/1990 |
| JP | 11-88111 A | 3/1999 |
| JP | 2000-69594 | 3/2000 |

* cited by examiner

*Primary Examiner*—Barbara Summons
(74) *Attorney, Agent, or Firm*—Frommer Lawrence & Haug LLP; Ronald R. Santucci

(57) ABSTRACT

A band-pass filter has a ladder-type circuit including first and second terminals whose characteristic impedances are Z0, and series elements and shunt elements disposed between a first terminal and a second terminal, each of the series elements and shunt elements containing a film bulk acoustic resonator. Assuming that characteristic impedance of any one of the series elements is Z1 and that characteristic impedance of any one of the shunt elements is Z2, the characteristic impedances Z0, Z1, and Z2 have a relation of 1<(Z1/Z0)<2, preferably 1.3<(Z1/Z0)<1.7, and 0.5<(Z2/Z0)<1, preferably 0.6<(Z2/Z0)<0.8.

3 Claims, 4 Drawing Sheets

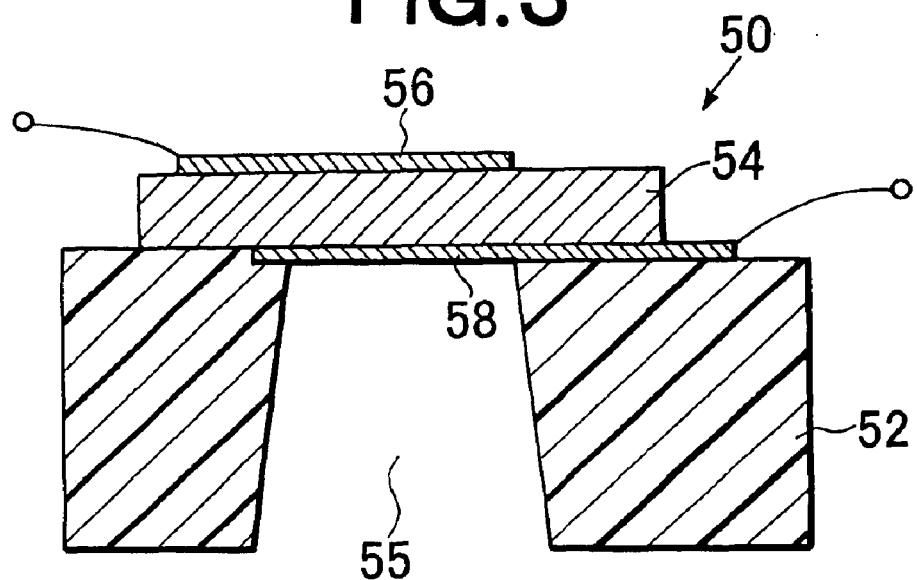
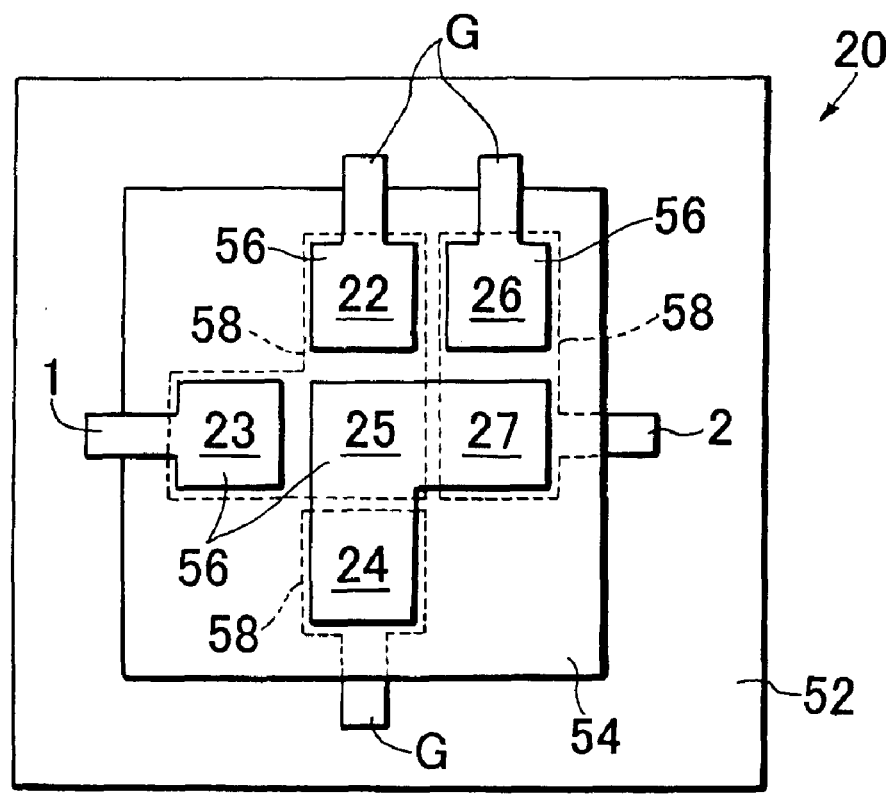

BAND-PASS FILTER USING FILM BULK ACOUSTIC RESONATOR

This application claims priority benefits from Japanese Patent Application No. 2002-321210 filed Nov. 5, 2002.

BACKGROUND OF THE INVENTION

1. Field of the Invention

The present invention relates to a technical field of a communication apparatus, particularly to a band-pass filter in which a film bulk acoustic resonator is used.

2. Description of the Related Art

There has been a filter using a film bulk acoustic resonator (FBAR) or thin-film piezoelectric resonator as a filter which can be used in a small size and at a high frequency. A representative equivalent circuit of the film bulk acoustic resonator is shown in FIG. 8. As seen from FIG. 8, one film bulk acoustic resonator includes series resonance portion and parallel resonance portion in the same manner as a SAW resonator. As a general method of using this resonator to constitute the filter, there is a ladder-type filter (e.g., see JP(A)-11-88111 (page 5, FIG. 18)). A frequency response of the ladder-type filter typically has a deep notch, and upper and lower pass band edges which have steep inclinations.

However, the conventional ladder-type filters tend to indicate poor stop band attenuation characteristics. That is, there is a problem that the attenuation characteristics are not sufficient in a stop band having a frequency higher or lower than that of the pass band.

In a proposed method of improving the poor stop band attenuation characteristics, an additional film bulk acoustic resonator is added to a filter constitution. However, with an increase of the number of elements, the characteristics are deteriorated in insertion loss. Moreover, with the number of resonators, the size of the whole filter increases.

JP(A) 52-19044 discloses a ladder-type filter comprising a shunt element having an equivalent parallel capacitance greater than that of a series element, which has a narrow pass band and a greater difference in lowest attenuation between the pass band and stop band. However, the elements of this filter do not use a film bulk acoustic resonator, but the filter is a SAW filter.

SUMMARY OF THE INVENTION

The present invention has been developed in consideration of the above-described situation, and an object of the present invention is to provide a ladder-type filter constituted of a film bulk acoustic resonator, in which stop band attenuation characteristics are improved without both increasing the size of the whole filter and deteriorating the characteristics in insertion loss.

In order to achieve the foregoing object, there is provided a band-pass filter having a ladder-type circuit including first and second terminals whose characteristic impedances are Z0, and series elements and shunt elements disposed between a first terminal and a second terminal, each of the series elements and shunt elements containing a film bulk acoustic resonator, wherein assuming that characteristic impedance of any one of the series elements is Z1 and that characteristic impedance of any one of the shunt elements is Z2, the characteristic impedances Z0, Z1, and Z2 have a relation of 1 <(Z1/Z0)<2 and 0.5<(Z2/Z0)<1.

Preferably, the characteristic impedances Z0, Z1, and Z2 have a relation of 1.3<(Z1/Z0)<1.7 and 0.6<(Z2/Z0)<0.8.

In an aspect of the present invention, the film bulk acoustic resonator comprises a substrate having a via-hole of substantially vertical taper angle so as to penetrate the substrate from one surface to the other surface thereof; and a stack containing a piezoelectric layer and a first and second electrodes sandwiching the piezoelectric layer, the stack is held on the one surface of the substrate, and a portion of the stack functions as a vibration portion facing the via-hole.

According to the present invention, it is possible to provide a filter in which stop band attenuation characteristics are improved without both increasing the size of the whole filter and deteriorating the characteristics in insertion loss.

BRIEF DESCRIPTION OF THE DRAWINGS

FIG. 3 is a cross-sectional view showing one embodiment of the film bulk acoustic resonator according to the present invention;

FIG. 4 is a plan view of the ladder-type filter including six elements according to one embodiment of the present invention;

DESCRIPTION OF THE PREFERRED EMBODIMENTS

A characteristic impedance Z of each element of a film bulk acoustic resonator is represented as follows in the vicinity of a central frequency of a filter to be prepared:

$$Z = 1/2\pi fC; \text{ and}$$

$$C = \epsilon_o \epsilon_r S/T,$$

wherein S denotes an area of opposed electrodes, f denotes the central frequency of the filter, $\epsilon_r$ denotes a relative dielectric constant of a thin-film piezoelectric, $\epsilon_o$ denotes a dielectric constant of vacuum, and T denotes a thickness of the thin-film piezoelectric. Moreover, C denotes a capacitance of the opposed electrodes.

In the conventional ladder-type filter, it is general to constitute each element to have the same characteristic impedance as that of a line to be connected to the filter. In such a case, however, there is a problem as described above.

It has now been revealed that if the characteristic impedance of some of series elements is set to be larger than that of the line, while the characteristic impedance of some of shunt elements is set to be smaller than that of the line, there can be provided a filter having improved stop band attenuation characteristics without both increasing the size of the whole filter and deteriorating the characteristics in insertion loss.

An embodiment of a band-pass filter using a film bulk acoustic resonator in the present invention will hereinafter be described in detail with reference to the drawings.

Figure 1:
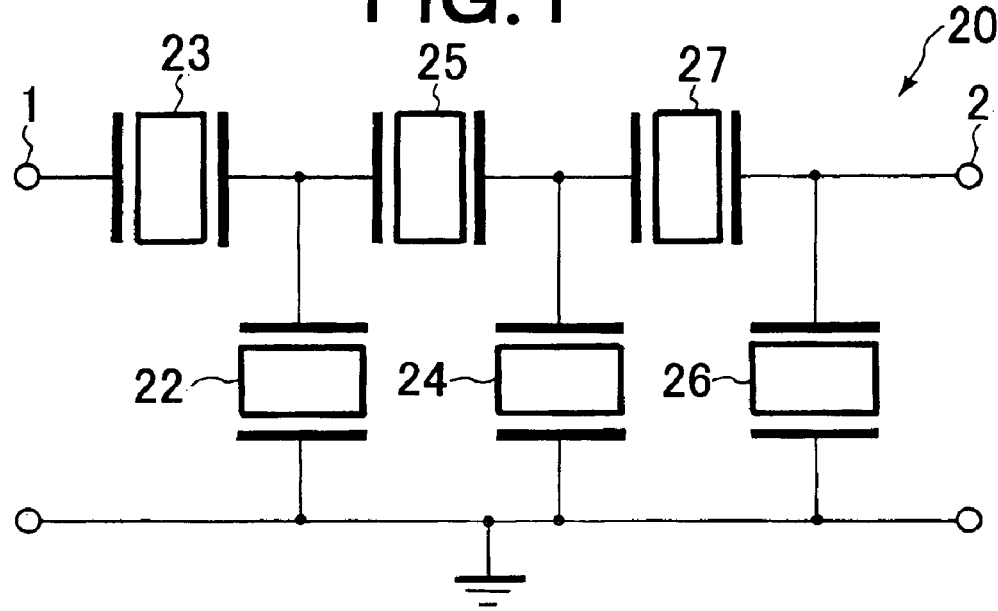
FIG. 1 is a schematic diagram of a ladder-type filter including six elements according to one embodiment of the present invention.

FIG. 1 shows one embodiment of the band-pass filter of the present invention including a ladder-type circuit constituted of six film bulk acoustic resonators.

The band-pass filter 20 using the film bulk acoustic resonators of the present invention constitutes the ladder-type circuit including a first terminal 1 and second terminal 2 each having characteristic impedance Z0, and series elements 23, 25, 27 and shunt elements 22, 24, 26 between the first terminal 1 and the second terminal 2. The band-pass filter includes the film bulk acoustic resonators in the series elements and shunt elements. Assuming that the characteristic impedance of any one of the series elements is Z1, and the characteristic impedance of any one of the shunt elements is Z2, the above-described Z0, Z1, and Z2 are in a relation of 1<(Z1/Z0)<2 and 0.5<(Z2/Z0)<1. When (Z1/Z0) of all the series elements is 1 or less, there is not an improvement effect of stop band attenuation characteristics. When (Z1/Z0) of all the series elements is 2 or more, the loss in pass band characteristics is unfavorably deteriorated. Moreover, when (Z2/Z0) of all the shunt elements is 0.5 or less, the pass band characteristics is deteriorated, and selectivity with the stop band is not steep. When (Z2/Z0) of all the shunt elements is 1 or more, there is not the improvement effect of stop band attenuation characteristics, and this is unfavorable.

Furthermore, with respect to any one of series elements and any one of shunt elements, the above-described Z0, Z1, and Z2 are preferably set to have a relation of 1.3<(Z1/Z0) <1.7 and 0.6<(Z2/Z0)<0.8. Accordingly, without making any change in each element, for example, by adjusting a resonance frequency by a change in an adjustment electrode or changing each element, attenuation characteristics are easily improved. It is to be noted that the adjustment electrode is an electrode further formed on an upper electrode in order to adjust the resonance frequency.

The characteristic impedance of the element can arbitrarily be adjusted by the adjustment of the areas of opposed electrodes constituted of upper and lower electrodes. The characteristic impedance can also be adjusted, when thickness or relative dielectric constant of a piezoelectric layer sandwiched between a pair of electrodes is changed.

In the present invention, the first terminal having the characteristic impedance Z0 indicates that the characteristic impedance is Z0 as viewed on the side of the first terminal, when the second terminal of the filter constituted of the film bulk acoustic resonator is terminated with the characteristic impedance of the line to be connected thereto. Similarly, the second terminal having the characteristic impedance Z0 indicates that the characteristic impedance is Z0, when the first terminal is terminated with the characteristic impedance of the line to be connected thereto and the whole filter is viewed on the side of the second terminal. In the present invention, the number of stages of the ladder-type circuit, that is, the number of series elements and shunt elements is not specifically limited.

Examples of the film bulk acoustic resonator constituting the series element and shunt element include a thin film bulk acoustic resonator (FBAR) using a thickness vibration of a piezoelectric thin film and a stacked thin film bulk acoustic wave resonators and filters (SBAR), which have heretofore been known. In these examples, the thin film mainly constituted of the piezoelectric and the electrode for driving the film are formed on a thin support film disposed on a substrate, and basic resonance in a gigahertz band is possible.

Figure 2:
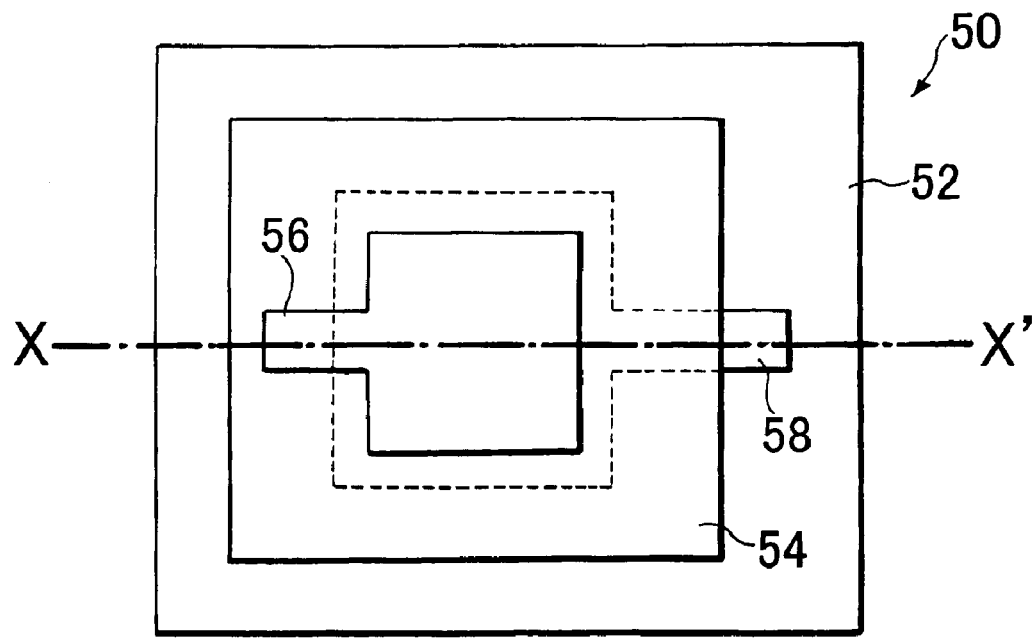
FIG. 2 is a plan view showing one embodiment of a film bulk acoustic resonator according to the present invention.

One example of the film bulk acoustic resonator is shown in FIGS. 2 and 3. FIG. 2 is a plan view of the film bulk acoustic resonator, and FIG. 3 is a cross-sectional view in X–X' of FIG. 2. In general, in a film bulk acoustic resonator denoted with reference numeral 50, a piezoelectric layer 54 which is sandwiched between a pair of electrodes 56, 58 is formed on a semiconductor substrate 52 made of silicon Si or gallium arsenic GaAs, for example. The electrode 56 is the upper electrode, and the electrode 58 is the lower electrode. If necessary, an insulating layer may also be formed on the surface of one electrode on the side of the semiconductor substrate, which is disposed so as to face the semiconductor substrate. A vibration space 55 such as a via-hole is formed in the substrate 52 so as to locate under a vibration portion of a stack containing the piezoelectric layer 54 and the upper and lower electrodes 56, 58.

The thin-film piezoelectric vibrators such as FBAR and SBAR applied to the resonator and filter using the elastic wave are manufactured, for example, as follows.

An underlayer film made of a dielectric thin film, a conductive thin film or a laminate thereof is formed on a substrate made of a semiconductor single crystal such as silicon, or metals of constant elastic modulus such as polycrystalline diamond and elinvar formed on a silicon wafer by various thin-film forming methods. The piezoelectric thin film is formed on the underlayer film, and further a required upper structure is formed thereon. After forming each layer or all the layers, each film is subjected to a physical or chemical treatment to carry out fine processing and patterning. After preparing a bridging structure in which a portion positioned under a vibration portion is removed from the substrate by anisotropic etching based on a wet method, the structure thus obtained is finally divided to obtain thin-film piezoelectric devices.

For example, for the thin-film piezoelectric vibrators described in JP(A) 58-153412 and JP(A) 60-142607, after forming an underlying film, lower electrode, piezoelectric thin film, and upper electrode on the upper surface of the substrate, a substrate portion positioned under a portion constituting a vibration portion is removed from the underside of the substrate, and a via-hole is formed to manufacture the vibrator. When the substrate is formed of silicon, heated KOH aqueous solution is used to etch and remove a part of the silicon substrate from the back surface, and the via-hole is formed. Accordingly, the resonator can be prepared so as to have a configuration in which an edge of a structure including the layer of the piezoelectric material held between a plurality of metal electrodes is supported by the portion around the via-hole on the upper surface of the silicon substrate.

In another method for manufacturing the film bulk acoustic resonators such as FBAR and SBAR applied to the thin-film piezoelectric device, for example, as disclosed in JP(A) 2-13109, an air bridge type FBAR device is manufactured. Usually, a sacrificial layer is first disposed, and next the piezoelectric resonator is prepared on the sacrificial layer. In the end or close to the end of the process, the sacrificial layer is removed to form the vibration portion. Since all the treatments are carried out with respect to the front surface of the wafer, this method does not require alignment of patterns in the opposite surfaces of the wafer, or a large-area opening in the back surface of the wafer. In JP(A) 2000-69594, a constitution and manufacturing method of the FBAR/SBAR device of an air bridge type are described in which phospho silicate glass (PSG) is used as the sacrificial layer.

Moreover, the film bulk acoustic resonator for use in the present invention is constituted of a substrate including a vibration space and a piezoelectric laminate structure formed on the substrate. The piezoelectric laminate structure includes at least a piezoelectric film, and metal electrodes formed on a part of the opposite surfaces of the piezoelectric film. The vibration space is formed as a via-hole 55 having a substantially vertical taper angle in the substrate 52 so as to penetrate the substrate from one surface to the other surface thereof by a deep carving type reactive ion etching (deep RIE) method which is deep trench etching using plasmas. This film bulk acoustic resonator can preferably be used.

For this type of film bulk acoustic resonator, to form the vibration portion including the structure in which the layer of the piezoelectric material is held between a plurality of metal electrodes on the upper surface of the substrate constituted of a semiconductor or insulator, a substrate portion positioned under the portion constituting the vibration portion is anisotropically removed from the underside of the substrate by the deep RIE method to form the via-hole constituting the vibration space. That is, by the application of the deep RIE method, the via-hole of substantially vertical taper angle is formed from one surface to the other surface of the substrate that a difference in dimension between a diaphragm portion whose lower electrode or insulating layer faces the vibration space and the opening in the lower surface of the substrate is small. Thus, a distance between centers of the film bulk acoustic resonators electrically connected to each other and disposed adjacent to each other can be shortened. Here, the taper angle is an angle formed by an average plane which is representative of a side wall formed from one surface toward the opposite surface of the substrate, and the lower surface of the substrate. When the taper angle is 80 to 100 angles, the angle can be said to be substantially vertical. The FBAR resonators can be integrated in this manner, electric resistances of the metal electrodes between which the piezoelectric layer is held are minimized, and a plurality of integrated film bulk acoustic resonators are combined. Therefore, it is possible to manufacture a high performance band-pass filter which is small in insertion loss.

As the piezoelectric-materials for the thin-film piezoelectric device, as well known, aluminum nitride (AlN), zinc oxide (ZnO), cadmium sulfide (CdS), lead titanate (PT (PbTiO$_3$)), lead zirconate titanate (PZT(Pb(Zr,Ti)O$_3$)), and the like are used.

As the electrodes (lower and upper electrodes), as well known, conductive films made of, for example, molybdenum (Mo), tungsten (W), and platinum (Pt) can be used. For Mo, since thermoelasticity loss is as low as about 1/56 of that of Al, the material is preferable especially for constituting the vibration portion which vibrates at a high frequency. It is possible to use not only Mo or W alone but also an alloy containing Mo or W which is a major component (content thereof is preferably 80 atomic % or more). Each of the lower and upper electrodes has a thickness, for example, of 50 to 250 nm. Examples of a method of forming the lower and upper electrodes include a sputtering method and vacuum evaporation method. Furthermore, if necessary, a photolithography technique for forming the pattern in a desired shape is applied.

If necessary, as well known, a dielectric film containing silicon oxide (SiO$_2$) or silicon nitride (Si$_3$N$_4$ or SiN$_x$) which is the major component can be used as an insulating layer formed between the substrate and the lower electrode. For the material of the insulating layer, the major component is a component whose content in the dielectric film is 50% or more by equivalent. The dielectric film may be formed of a single layer or a plurality of layers including a layer for enhancing adhesion.

The film bulk acoustic resonator described above can appropriately be arranged to constitute the ladder-type filter. One example of the arrangement is shown in FIG. 4. Reference numerals 1, 2, 20, 22 to 27, 52, 54, 56 and 58 denotes a member, portion, etc. shown in FIGS. 1 to 3 with the same reference numerals, respectively. The reference symbol G denotes the ground terminal. The electrodes 56, 58 of the filter 20 extend in parallel with each other with the piezoelectric layer 54 interposed therebetween to constitute each resonator and to connect each resonator to the adjacent resonator.

In the present invention, with respect to the characteristic impedance Z0 of the first and second terminals, the impedance Z1 of any one of the series elements is set to be large. Moreover, with respect to the characteristic impedance Z0 of the first and second terminals, the impedance Z2 of any one of the shunt elements is set to be small. Accordingly, the stop band attenuation characteristics are improved. Especially, when Z0, Z1, and Z2 are in a relation of $1<(Z1/Z0)<2$ and $0.5<(Z2/Z0)<1$, preferable stop band attenuation characteristics can be obtained.

Furthermore, when Z0, Z1, and Z2 are set to have a relation of $1.3<(Z1/Z0)<1.7$ and $0.6<(Z2/Z0)<0.8$, the attenuation characteristics can easily be improved without adding changes to each element such as the adjustment of the resonance frequency by the change in the adjustment electrode.

Examples and comparative examples will hereinafter be described to describe the present invention in further detail.

EXAMPLE 1

Figure 5:
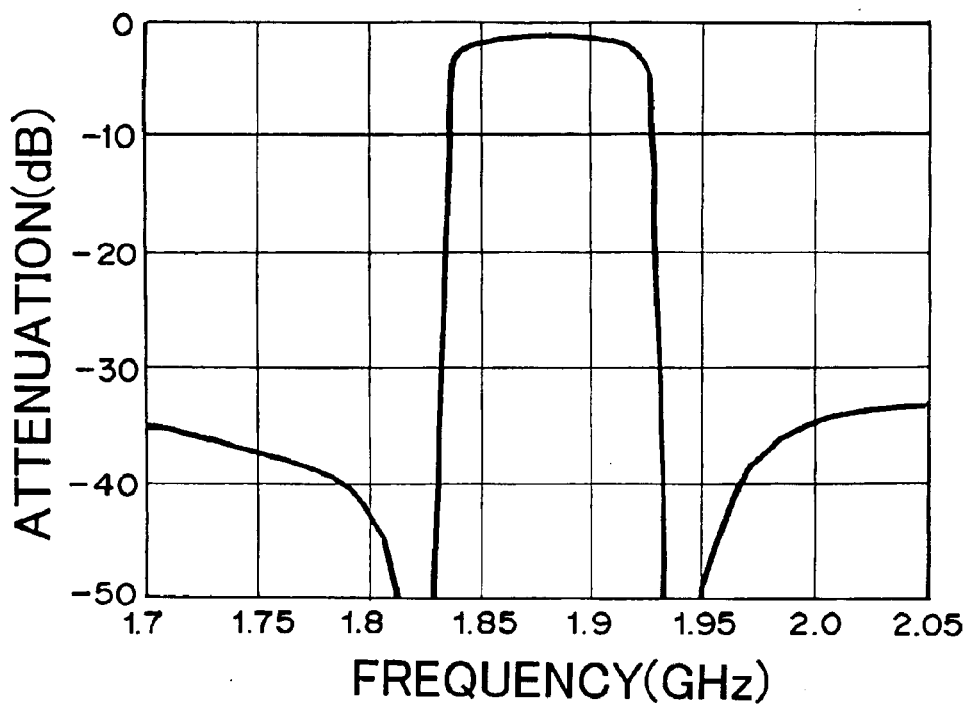
FIG. 5 is a frequency response diagram of Example 1.

The materials and thicknesses of the constituting members were set as described in Table 1 to form the ladder-type filter constituted of six FBARs shown in FIG. 1 including FBAR configured as shown in FIG. 3. That is, the characteristic impedance Z1 of one of the series elements was set to 70Ω which was larger than the characteristic impedance Z0 (50Ω herein) of the first and second terminals. The characteristic impedance Z2 of one of the shunt elements was set to 35Ω which was smaller than the characteristic impedance Z0 (50Ω herein) of the first and second terminals. A frequency response of this filter is shown in FIG. 5. When the characteristic impedances of the series and shunt elements were set in a specified range, it was possible to obtain the band-pass filter superior in the stop band attenuation characteristics as shown in FIG. 5. It is seen that the improvement of the stop band attenuation characteristics by 10 dB or more is obtained as compared with Comparative Example 1 described later.

TABLE 1

| Series element film bulk acoustic resonator (23, 25, 27) | | | | Shunt element film bulk acoustic resonator (22, 24, 26) | | | |
|---|---|---|---|---|---|---|---|
| | Thickness | | | | Thickness | | |
| Layer | 23 | 25 | 27 | Layer | 22 | 24 | 26 |
| | | | | Adjustment electrode: Mo (μm) | 0.04 | 0.04 | 0.04 |
| Upper electrode: Mo (μm) | 0.25 | 0.25 | 0.25 | Upper electrode: Mo (μm) | 0.25 | 0.25 | 0.25 |
| Piezoelectric layer: AlN (μm) | 1.6 | 1.6 | 1.6 | Piezoelectric layer: AlN (μm) | 1.6 | 1.6 | 1.6 |
| Lower electrode: Mo (μm) | 0.25 | 0.25 | 0.25 | Lower electrode: Mo (μm) | 0.25 | 0.25 | 0.25 |
| Opposed electrode area (μm × μm) | 173 173 | 160 160 | 189 189 | Opposed electrode area (μm × μm) | 189 189 | 226 226 | 189 189 |
| Characteristic impedance (Ω) | 60 | 70 | 50 | Characteristic impedance (Ω) | 50 | 35 | 50 |
| Z1/Z0 | 1.2 | 1.4 | 1.0 | Z2/Z0 | 1.0 | 0.7 | 1.0 |

EXAMPLE 2

The materials and thicknesses of the constituting members were set as described in Table 2 to form the ladder-type filter constituted of six FBARs shown in FIG. 1 including FBAR configured as shown in FIG. 3. That is, the characteristic impedance Z1 of one of the series elements was set to 95Ω which was larger than the characteristic impedance Z0 (50Ω herein) of the first and second terminals. The characteristic impedance Z2 of one of the shunt elements was set to 28Ω which was smaller than the characteristic impedance Z0 (50Ω herein) of the first and second terminals. Furthermore, to adjust the pass frequency band width, the thickness of the adjustment electrode of one (element 24) of the shunt elements.

Accordingly, it was possible to obtain substantially the same frequency characteristics as those shown in Example 1.

TABLE 2

| Series element film bulk acoustic resonator (23, 25, 27) | | | | Shunt element film bulk acoustic resonator (22, 24, 26) | | | |
|---|---|---|---|---|---|---|---|
| | Thickness | | | | Thickness | | |
| Layer | 23 | 25 | 27 | Layer | 22 | 24 | 26 |
| | | | | Adjustment electrode: Mo (μm) | 0.04 | 0.047 | 0.04 |
| Upper electrode: Mo (μm) | 0.25 | 0.24 | 0.25 | Upper electrode: Mo (μm) | 0.25 | 0.25 | 0.25 |
| Piezoelectric layer: AlN (μm) | 1.6 | 1.6 | 1.6 | Piezoelectric layer: AlN (μm) | 1.6 | 1.6 | 1.6 |
| Lower electrode: Mo (μm) | 0.25 | 0.25 | 0.25 | Lower electrode: Mo (μm) | 0.25 | 0.25 | 0.25 |
| Opposed electrode area (μm × μm) | 149 149 | 141 141 | 189 189 | Opposed electrode area (μm × μm) | 189 189 | 252 252 | 189 189 |
| Characteristic impedance (Ω) | 80 | 95 | 50 | Characteristic impedance (Ω) | 50 | 28 | 50 |
| Z1/Z0 | 1.6 | 1.9 | 1.0 | Z2/Z0 | 1.0 | 0.56 | 1.0 |

COMPARATIVE EXAMPLE 1

Figure 6:
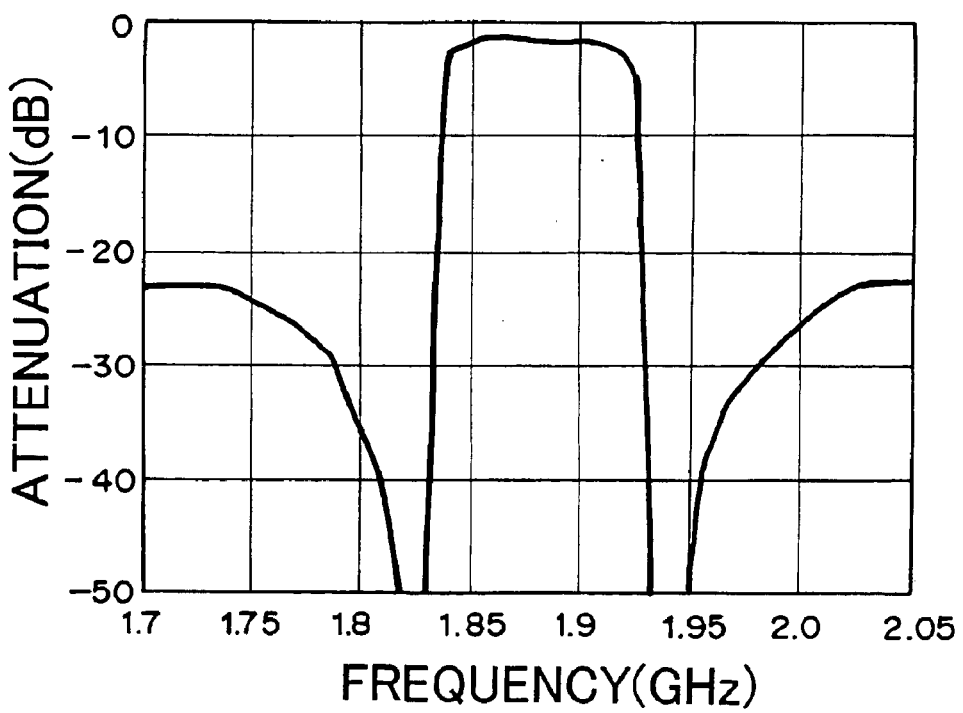
FIG. 6 is a frequency response diagram of Comparative Example 1.

The materials and thicknesses of the constituting members were set as described in Table 3 to form the ladder-type filter constituted of six FBARs shown in FIG. 1 including FBAR configured as shown in FIG. 3. That is, the characteristic impedance of each resonator of the series elements and shunt elements constituting the ladder-type filter was set to 50Ω which was the same as that of the first and second terminals. The frequency response of this filter is shown in FIG. 6. It is seen that the stop band attenuation characteristics are inferior.

TABLE 3

| Series element film bulk acoustic resonator (23, 25, 27) | | | | Shunt element film bulk acoustic resonator (22, 24, 26) | | | |
|---|---|---|---|---|---|---|---|
| | Thickness | | | | Thickness | | |
| Layer | 23 | 25 | 27 | Layer | 22 | 24 | 26 |
| | | | | Adjustment electrode: Mo (μm) | 0.04 | 0.04 | 0.04 |
| Upper electrode: Mo (μm) | 0.25 | 0.25 | 0.25 | Upper electrode: Mo (μm) | 0.25 | 0.25 | 0.25 |
| Piezoelectric layer: AlN (μm) | 1.6 | 1.6 | 1.6 | Piezoelectric layer: AlN (μm) | 1.6 | 1.6 | 1.6 |
| Lower electrode: Mo (μm) | 0.25 | 0.25 | 0.25 | Lower electrode: Mo (μm) | 0.25 | 0.25 | 0.25 |
| Opposed electrode area (μm × μm) | 189 189 | 189 189 | 189 189 | Opposed electrode area (μm × μm) | 189 189 | 189 189 | 189 189 |
| Characteristic impedance (Ω) | 50 | 50 | 50 | Characteristic impedance (Ω) | 50 | 50 | 50 |
| Z1/Z0 | 1.0 | 1.0 | 1.0 | Z2/Z0 | 1.0 | 1.0 | 1.0 |

COMPARATIVE EXAMPLE 2

Figure 7:
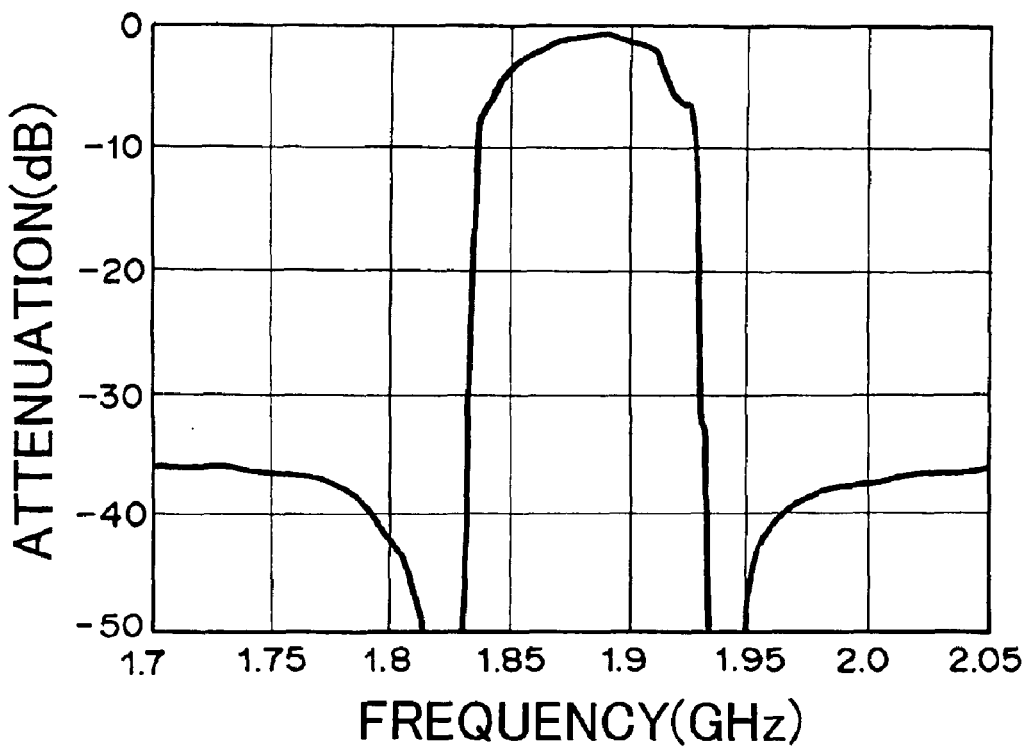
FIG. 7 is a frequency response diagram of Comparative Example 2.
Figure 8:
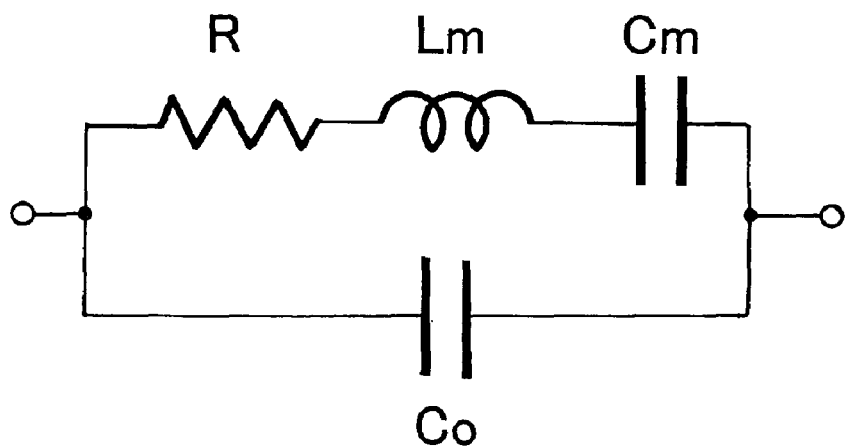
FIG. 8 is an equivalent circuit diagram of the film bulk acoustic resonator.

The materials and thicknesses of the constituting members were set as described in Table 4 to form the ladder-type filter constituted of six FBARs shown in FIG. 1 including FBAR configured as shown in FIG. 3. That is, the characteristic impedance Z1 of one of the series elements was set to be larger than twice the characteristic impedance Z0 (50Ω herein) of the first and second terminals. The characteristic impedance Z2 of one of the shunt elements was set to be smaller than ½ of the characteristic impedance Z0 (50Ω herein) of the first and second terminals. The frequency response of the filter is shown in FIG. 7. It is seen from FIG. 7 that matching in the pass band is deteriorated, ripple is large, and insertion loss is deteriorated.

TABLE 4

| | Series element film bulk acoustic resonator (23, 25, 27) | | | | Shunt element film bulk acoustic resonator (22, 24, 26) | | |
|---|---|---|---|---|---|---|---|
| | Thickness | | | | Thickness | | |
| Layer | 23 | 25 | 27 | Layer | 22 | 24 | 26 |
| Adjustment electrode Mo: (µm) | | | | | 0.04 | 0.04 | 0.04 |
| Upper electrode: Mo (µm) | 0.25 | 0.25 | 0.25 | Upper electrode: Mo (µm) | 0.25 | 0.25 | 0.25 |
| Piezoelectric layer: AlN (µm) | 1.6 | 1.6 | 1.6 | Piezoelectric layer: AlN (µm) | 1.6 | 1.6 | 1.6 |
| Lower electrode: Mo (µm) | 0.25 | 0.25 | 0.25 | Lower electrode: Mo (µm) | 0.25 | 0.25 | 0.25 |
| Opposed electrode area (µm × µm) | 173 173 | 160 160 | 122 122 | Opposed electrode area (µm × µm) | 189 189 | 300 300 | 189 189 |
| Characteristic impedance (Ω) | 60 | 70 | 120 | Characteristic impedance (Ω) | 50 | 20 | 50 |
| Z1/Z0 | 1.2 | 1.4 | 2.4 | Z2/Z0 | 1.0 | 0.4 | 1.0 |

What is claimed is:

1. A band-pass filter having a ladder-type circuit including first and second terminals whose characteristic impedances are Z0, and series elements and shunt elements disposed between a first terminal and a second terminal, each of the series elements and shunt elements containing a film bulk acoustic resonator, wherein assuming that characteristic impedance of any one of the series elements is Z1 and that characteristic impedance of any one of the shunt elements is Z2, the characteristic impedances Z0, Z1, and Z2 have a relation of 1<(Z1/Z0)<2 and 0.5<(Z2/Z0)<1.

2. The band-pass filter according to claim 1, wherein the characteristic impedances Z0, Z1, and Z2 have a relation of 1.3<(Z1/Z0)<1.7 and 0.6<(Z2/Z0)<0.8.

3. The band-pass filter according to claim 1, wherein the film bulk acoustic resonator comprises a substrate having a via-hole of substantially vertical taper angle so as to penetrate the substrate from one surface to the other surface thereof; and a stack containing a piezoelectric layer and a first and second electrodes sandwiching the piezoelectric layer, the stack is held on the one surface of the substrate, and a portion of the stack functions as a vibration portion facing the via-hole.

* * * * *